United States Patent
Knoll et al.

(10) Patent No.: US 8,683,683 B2
(45) Date of Patent: Apr. 1, 2014

(54) METHOD FOR POSITIONING AND MOUNTING AN LED ASSEMBLY AS WELL AS A POSITIONING BODY FOR THIS PURPOSE

(75) Inventors: Franz Knoll, Vienna (AT); Michael Maryschka, Vienna (AT); Gregor Svobodnik, Vienna (AT); Boris Thaller, Vienna (AT)

(73) Assignee: Continental Automotive GmbH, Hannover (DE)

( * ) Notice: Subject to any disclaimer, the term of this patent is extended or adjusted under 35 U.S.C. 154(b) by 1012 days.

(21) Appl. No.: 12/739,042

(22) PCT Filed: Oct. 2, 2008

(86) PCT No.: PCT/EP2008/063240
§ 371 (c)(1),
(2), (4) Date: Apr. 21, 2010

(87) PCT Pub. No.: WO2009/053230
PCT Pub. Date: Apr. 30, 2009

(65) Prior Publication Data
US 2010/0302777 A1 Dec. 2, 2010

(30) Foreign Application Priority Data
Oct. 24, 2007 (DE) .......................... 10 2007 050 893

(51) Int. Cl.
*H05K 3/30* (2006.01)
*B23P 19/00* (2006.01)

(52) U.S. Cl.
USPC .................. 29/832; 29/739; 29/740; 29/741; 29/834; 362/373

(58) Field of Classification Search
USPC ...................................... 29/832, 834; 362/373
See application file for complete search history.

(56) References Cited

U.S. PATENT DOCUMENTS

| 6,299,337 | B1 | 10/2001 | Bachl et al. | 362/545 |
| 7,662,094 | B2 * | 2/2010 | Iddan | 600/176 |
| 2005/0281033 | A1 | 12/2005 | Coushaine et al. | 362/294 |

(Continued)

FOREIGN PATENT DOCUMENTS

DE 19909399 C1 1/2001 ............... F21S 8/10

(Continued)

OTHER PUBLICATIONS

International PCT Search Report, PCT/EP2008/063240, 4 pages.

Primary Examiner — Carl Arbes
(74) Attorney, Agent, or Firm — King & Spalding L.L.P.

(57) ABSTRACT

In a method for positioning and mounting, on a carrier body (6), an LED assembly (1) preassembled on a circuit board (4), the circuit board (4) having the LED assembly (1) is placed and glued onto the carrier body (6), the LED assembly (1) being brought into the prescribed position relative to the carrier body (6) after being placed on the carrier body (6) by a positioning body (11) having centering elements (17) that contact the LED assembly (1) on one side and the carrier body (6) on the other, wherein the circuit board (4) having the LED assembly (1) is aligned with the carrier body (6). The positioning body (11) has a leg (15, 16) extending from a connecting part (12) and having centering elements (17) for contacting the LED assembly (1) on one side and the carrier body (6) on the other side.

20 Claims, 8 Drawing Sheets

(56) References Cited

U.S. PATENT DOCUMENTS

| | | | |
|---|---|---|---|
| 2006/0114678 A1* | 6/2006 | Shimonishi et al. | 362/311 |
| 2006/0180623 A1 | 8/2006 | Reynolds et al. | 224/542 |
| 2007/0246717 A1* | 10/2007 | Ng | 257/81 |
| 2008/0278954 A1* | 11/2008 | Speier | 362/373 |
| 2009/0020689 A1 | 1/2009 | Frenzel et al. | H01J 40/14 |

FOREIGN PATENT DOCUMENTS

| | | | |
|---|---|---|---|
| DE | 20101359 U1 | 5/2001 | F21S 2/00 |
| DE | 102006005518 A1 | 8/2006 | B60R 7/02 |
| DE | 20 2006 016 336 U1 | 2/2007 | F21K 99/00 |
| DE | 102006010297 B3 | 7/2007 | H01Q 1/38 |
| DE | 10 2006 005 519 A1 | 8/2007 | H01L 31/0203 |

* cited by examiner

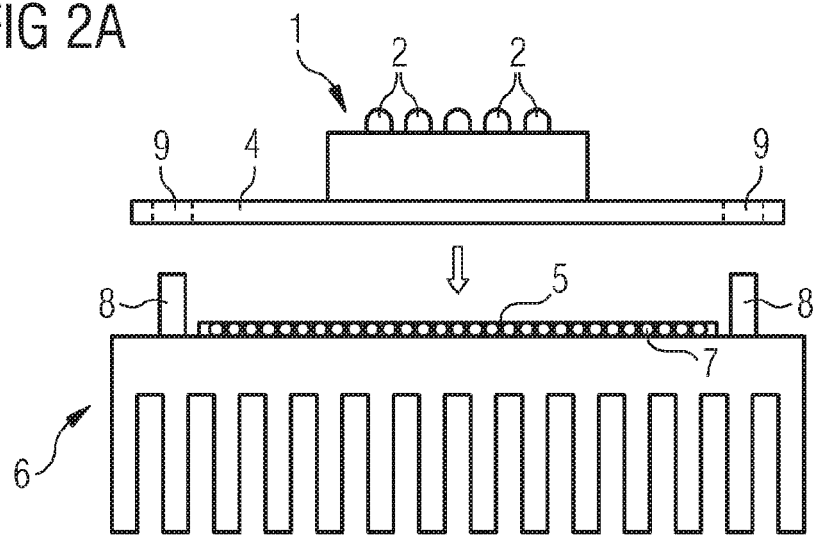
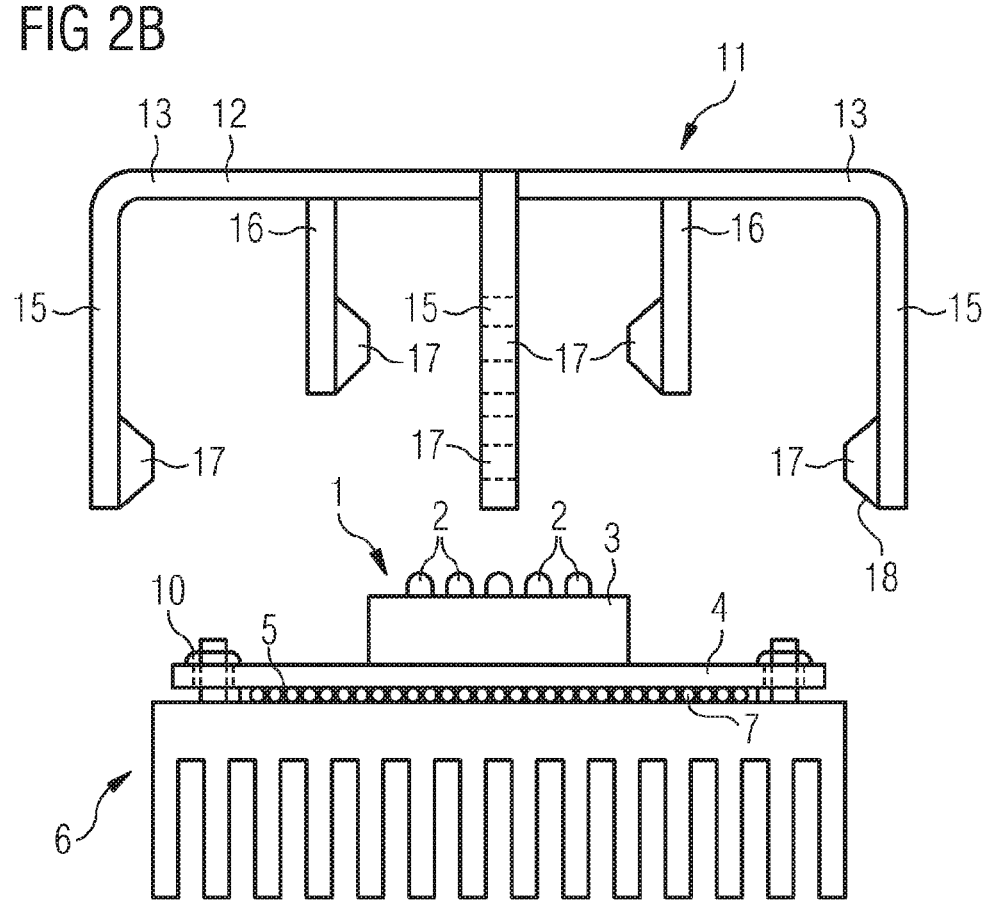

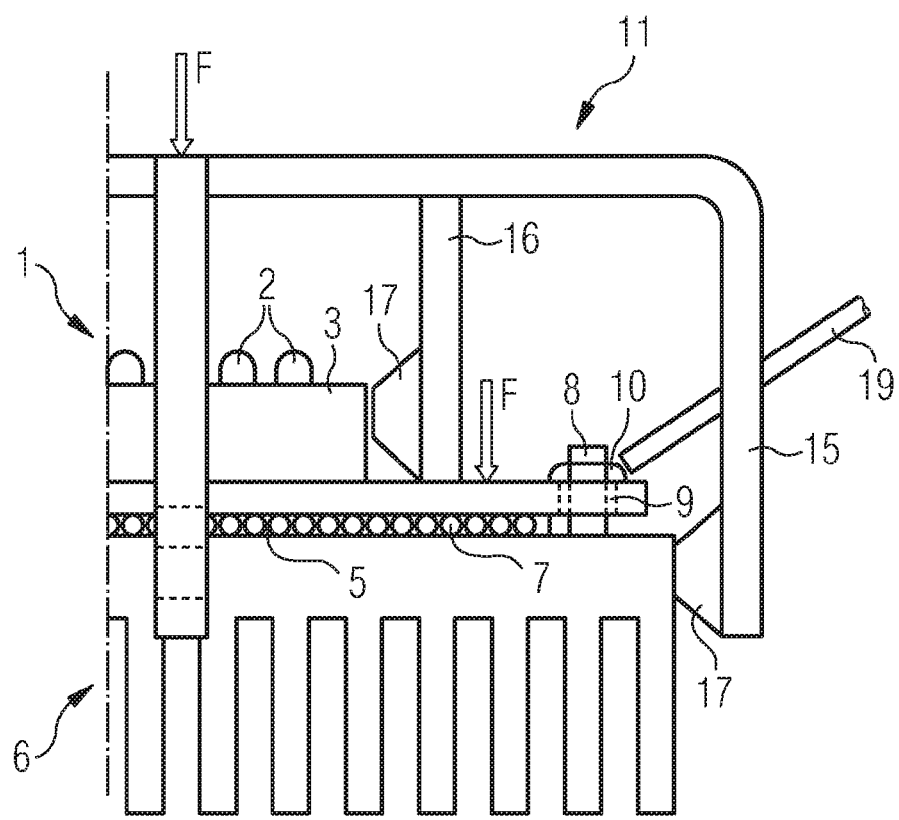

METHOD FOR POSITIONING AND MOUNTING AN LED ASSEMBLY AS WELL AS A POSITIONING BODY FOR THIS PURPOSE

CROSS-REFERENCE TO RELATED APPLICATIONS

This application is a U.S. National Stage Application of International Application No. PCT/EP2008/063240 filed Oct. 2, 2008, which designates the United States of America, and claims priority to German Application No. 10 2007 050 893.1 filed Oct. 24, 2007, the contents of which are hereby incorporated by reference in their entirety.

TECHNICAL FIELD

The invention relates to a method of positioning and mounting at least one LED assembly, which is preassembled on a printed circuit board, on a carrier body, wherein the printed circuit board with the LED assembly is placed and glued onto the carrier body.

The invention further relates to a positioning body for implementing this method.

BACKGROUND

Here, by an "LED assembly" is meant quite generally an LED (light-emitting diode) or a group (array) of LEDs, in any desired arrangement, such as square, circular or linear, wherein the assembly conventionally comprises a substrate and a housing. In the present case this assembly is preassembled on a printed circuit board. Here, by this "printed circuit board" is meant quite generally a substrate or component, made for example of FR4, ceramic but also aluminum etc., that carries printed conductors.

It is known for LED assemblies to be preassembled on printed circuit boards and then attached to a carrier body or lead frame, usually a heat sink, for example to keep the temperature of the LED assembly at a suitable value during operation. Such LED assemblies are increasingly being used in motor vehicles, where they are used in a luminaire housing, for example for headlamps, but also for tail lights, brake lights, indicator lights etc., but also quite generally in lighting engineering or light control devices.

From DE 199 09 399 C1 for example a partially flexible multiple LED assembly for stepped mounting in a luminaire housing of a motor vehicle is known.

One problem when mounting LED assemblies is that in the respective luminaire housing or the like they have to be positioned on the carrier body with great accuracy in order to achieve an optimum luminous efficiency in the desired emission direction. Difficulties are presented here by the high number of degrees of freedom when positioning the LED assemblies, an added problem being that the LED assembly is preassembled on a printed-circuit board; in the case of this mounting, as tests have revealed, relatively large tolerances exist. As has been demonstrated in practice, it is therefore not enough for the printed-circuit board itself to be positioned on the carrier body or heat sink exactly, for example by means of centering pins on the heat sink and centering holes in the printed-circuit board, rather the LED assembly has to be adjusted exactly relative to the carrier body or heat sink. Without exact positioning the desired high luminous efficiency of the LED assembly is not possible as the positioning tolerances lead to high light depreciation, or the light for example cannot be launched correctly in a fiber-optic conductor.

SUMMARY

According to various embodiments, a method can be provided of positioning and mounting LED assemblies, which are preassembled on printed-circuit boards, on a carrier body, in particular a heat sink, whereby a positioning with great accuracy is enabled. At the same time, the method is to be capable of rapid implementation with a minimum outlay.

According to further embodiments, a suitable auxiliary means can be provided, namely a positioning- or fixing body, for implementation of the method.

According to an embodiment, in a method of positioning and mounting at least one LED assembly, which is preassembled on a printed-circuit board, on a carrier body, the printed-circuit board with the LED assembly is placed and glued onto the carrier body, wherein the LED assembly after placing onto the carrier body is brought into the defined position relative to the carrier body by means of a positioning body, which comprises centering elements that come to rest on the one hand on the LED assembly or the printed-circuit board thereof and on the other hand on the carrier body, wherein the printed-circuit board with the LED assembly is adjusted on the carrier body.

According to a further embodiment of the method, before the positioning body is attached, the printed-circuit board is placed by means of centering holes onto centering pins provided on the carrier body. According to a further embodiment of the method, the printed-circuit board after attachment of the positioning body can be fixed on the carrier body with the aid of a fast-curing adhesive, for example a UV-curing adhesive. According to a further embodiment of the method, after the positioning of the LED assembly relative to the carrier body the printed-circuit board can be glued on the carrier body by means of a heat-conducting adhesive with the simultaneous incorporation of distance elements, for example glass spherules. According to a further embodiment of the method, after the fixing of the printed-circuit board on the carrier body with the aid of the fast-curing adhesive the positioning body can be removed. According to a further embodiment of the method, after removal of the positioning body the heat-conducting adhesive between the printed-circuit board and the carrier body may still be completely cured. According to a further embodiment of the method, the positioning body can be left in its position as a functional body, for example reflector, design element or cover. According to a further embodiment of the method, a plurality of LED assemblies, each preassembled on a printed-circuit board, are simultaneously positioned by means of a common positioning body on a carrier body having a plurality of mounting locations for the LED assemblies.

According to another embodiment, a positioning body for implementing the method as described above may comprise limbs, which project down from a connecting part and have centering elements provided for seating on the one hand on the LED assembly and on the other hand on the carrier body. According to a further embodiment of the positioning body, at least one of the centering elements can be formed by a centering face. According to a further embodiment of the positioning body, at least one of the centering elements can be formed by a detent projection that snaps into a recess on the carrier body. According to a further embodiment of the positioning body, the connecting part can be of a cross-shaped construction, wherein the limbs project down from the cross arms. According to a further embodiment of the positioning body, the connecting part may take the form of a concave reflector having an opening for passage of the LED, wherein the limbs project down from the rear of the reflector. According to a further embodiment of the positioning body, a plurality of connecting parts, each with downwardly projecting limbs, can be connected into an integrated unit. According to a further embodiment of the positioning body, the connecting parts may be connected into the integrated unit with the simultaneous formation of steps. According to a further embodiment of the positioning body, in the case of association with a common carrier body for mounting a plurality of LED assemblies in one plane, only the outer regions of the connecting parts unit may be provided with limbs provided for seating on the sides of the common carrier body. According to a further embodiment of the positioning body, it can be made of a material that is harder than the carrier body and the LED assembly or assemblies. According to a further embodiment of the positioning body, it can be made of hardened steel. According to a further embodiment of the positioning body, it can be made of glass-fiber-reinforced plastics material.

BRIEF DESCRIPTION OF THE DRAWINGS

The invention is described in more detail below by way of embodiments, to which however the invention is not to be limited, and with reference to the drawings, in which is shown in detail:

FIGS. 2A, 2B and 2C various phases during the positioning and mounting of the LED assembly plus printed-circuit board on the heat sink according to FIGS. 1 and 2;

DETAILED DESCRIPTION

Figure 1:
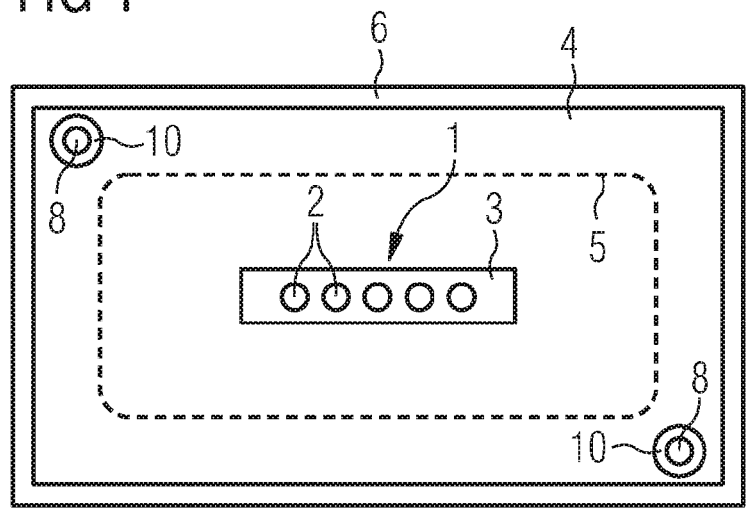
FIG. 1 a plan view of a printed-circuit board with an LED assembly mounted thereon, wherein the printed-circuit board in turn is mounted on a carrier body in the form of a heat sink.

By applying the method according to various embodiments, with simultaneous use of the positioning body according to other embodiments, it is possible in a simple and rapid manner to align LED assemblies with the printed-circuit boards exactly relative to the respective carrier body, in particular the heat sink, even if the adjustment of the LED assemblies on the printed-circuit boards does not have the required accuracy, i.e. if mounting tolerances exist here, these are eliminated by the indicated procedure. The positioning body used in accordance with various embodiments centers the LED assembly, i.e. the LED substrate or -housing, and the printed-circuit board with the desired high accuracy relative to the carrier body or heat sink, generally lead frame. In this case, in an as such known manner the printed-circuit board by means of the centering holes provided in it may be pushed onto centering pins of the carrier body, wherein here there is usually a clearance to allow displacement of the printed-circuit board relative to the carrier body. This clearance is used to adjust the LED assembly relative to the carrier body. This adjustment is effected with the aid of the positioning body, which comprises—in particular on sufficiently rigid, optionally slightly resilient limbs—centering elements, for example simply in the form of centering faces or however in the form of detent projections. The positioning body may be made for example of steel, in particular hardened steel, but may also, if attached not merely provisionally but permanently, be made of plastics material or plastic-glass composite materials, such as in particular glass-fiber-reinforced plastics material. The hardness of the positioning body material is namely preferably greater than the hardness of the carrier body and of the substrate of the assembly in order to avoid abrasion of the positioning body. A permanent mounting of the positioning body is provided if this positioning body has a further function, for example as a design element or as a reflector. In this case, a latching of the positioning body with the aid of its centering-element detent projections on the carrier body is advantageously provided.

If however the positioning body is removed, optionally however also in the case of permanent mounting, it is advantageous if, in the case of placing of the printed-circuit board by means of centering holes and centering pins onto the carrier body, the printed-circuit board is fixed with the aid of a fast-curing adhesive at the centering pins after the positioning body has been attached and the LED module has been adjusted relative to the carrier body. After curing of the fast-curing adhesive the positioning body may be removed without having to wait until a preferably provided, usually slow-curing adhesive, in particular a heat-conducting adhesive, by means of which the printed-circuit board is surface-connected to the carrier body, has permanently (completely) cured. As a fast-curing adhesive it is possible to use for example an as such known UV-curing adhesive, for example the adhesives known by the trade names of Loctite 661 or DYMAX 3072 and/or DYMAX 3069. In the present case, the fast-curing adhesive should cure rapidly with a view to short manufacturing times, be non-toxic for occupational safety reasons, moreover not attack the components to be glued together, in particular the printed-circuit board, optionally be permanently flexible and be suitable for the desired application, for example in motor vehicles, wherein a high thermal stability, for example from −40° C. to +125° C. or more, vibration strength and insensitivity to chemicals are desirable. It is also conceivable for the definitive connection between printed-circuit board and carrier body to be established exclusively by means of this fast-curing adhesive, i.e. for the heat-conducting layer between the printed-circuit board and the carrier board to be, not adhesive, but simply in the form of a heat-conducting paste.

If the printed-circuit board after positioning of the LED assembly relative to the carrier body is glued by means of a heat-conducting adhesive—which has previously been applied to the underside of the printed-circuit board or to the upper side of the carrier body—or if instead a heat-conducting paste is applied, then it is also preferred, with a view to an exact vertical positioning ("vertical" in the sense of at right angles to the main surface of the printed-circuit board), if distance elements, such as in particular glass spherules of a defined diameter, are incorporated in the heat-conducting material (adhesive or paste). The printed-circuit board is then pressed either by the external application of a force or with the aid of the positioning body, in the case of a latching thereof, towards the carrier body in order thereby to ensure the exact spacing between printed-circuit board and carrier body by means of the described distance elements, in particular the glass spherules.

It is conceivable for a plurality of LED assemblies, each preassembled on a printed-circuit board, to be simultaneously positioned by means of a common positioning body on a carrier body unit having a plurality of mounting locations for the LED assemblies. Thus, in a particularly efficient manner in a single operation a plurality of groups of LEDs may be mounted with exact adjustment on a multiple carrier body or however on a plurality of carrier bodies, which are connected to one another—and which may optionally also be arranged in a stepped manner.

For example, for many applications accuracy in the order of magnitude of +/−0.2 mm is required, wherein previously in practice at best +/−0.5 mm was achievable. With the technique according to various embodiments an accuracy of for example +/−0.1 mm may be achieved without difficulty.

As centering elements, the positioning body may for example simply have flat centering faces, but it is also conceivable to provide rounded centering faces, in particular spherical-cup centering faces, wherein these centering faces rest for example laterally against a defined seating surface (fit surface) on the LED assembly, on the housing or substrate thereof, and/or on the carrier body (heat sink). The accuracy of the positioning of the LED assembly therefore depends upon the accuracy of manufacture of the positioning body. To this extent it is advantageous for the connecting part of the positioning body to be of a relatively solid design, although, as tests have revealed, a double bow shape, namely a cross-shaped design, of the connecting part with a suitable width of the webs is sufficient; the limbs then project down from the cross arms preferably at right angles. In the situation where the positioning body is also subsequently to perform a reflector function or similar function and is therefore permanently mounted, the connecting part may be designed in accordance with the function, for example as a concave reflector with an, in particular central, opening for passage of the LED or LED group, wherein the limbs project down from the rear of the reflector. Here too, as in the case of a cross-shaped or bow-shaped connecting part, an integral construction of the positioning body is advantageous for reasons of dimensional stability.

In order to be able to mount a plurality of LED assemblies in one plane on a correspondingly large carrier body or heat sink, a corresponding plurality of connecting parts, one connecting part for each LED assembly, are used, wherein these connecting parts may however be connected into an integrated, preferably integral positioning body unit. The individual connecting parts are then provided in each case with downward projecting limbs, although, particularly in the case of a planar arrangement, with one planar carrier body, it is sufficient if only the outer connecting parts are provided with limbs intended for seating against the sides of the common carrier body.

Especially for applications in the lighting system of motor vehicles a stepped arrangement of LED assemblies is often desirable and, here too, by means of a common positioning body, which comprises a plurality of connecting parts arranged in the form of steps relative to one another, it is possible to achieve a simultaneous positioning and mounting of the plurality of LED assemblies on the stepped carrier body or heat sink.

Figure 2:
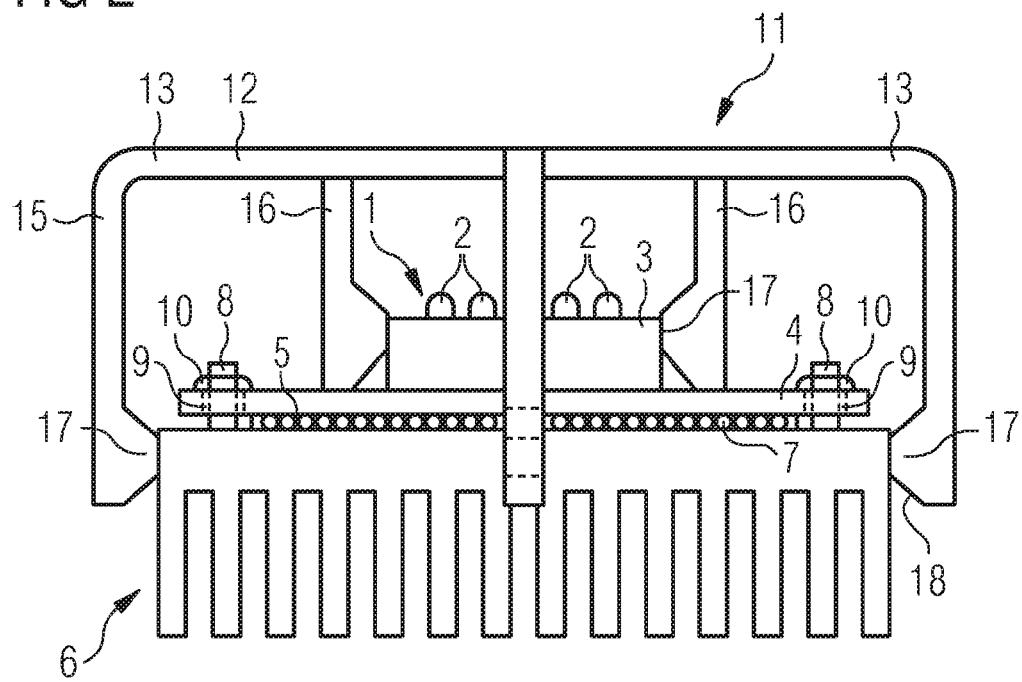
FIG. 2 an elevation of this arrangement according to FIG. 1, wherein a positioning body used in the mounting of the printed-circuit board with the LED assembly is additionally represented.

FIGS. 1 and 2 show an LED assembly 1, in which a plurality of individual LED semiconductors or LED chips, hereinafter abbreviated to LEDs (light-emitting diodes) 2 are disposed on a substrate 3. This LED assembly 1 is mounted on a base in the form of a printed-circuit board 4, which in the illustrated example is in turn fastened with the aid of a heat-conducting adhesive 5 on a carrier body in the form of a heat sink 6. The heat-conducting adhesive 5 (or generally a heat-conducting paste) is to ensure an efficient removal of heat from the substrate 3 of the LED assembly 1 to the heat sink 6. On the other hand, for the exact positioning of the LEDs 2 in the operating position it is also important that the height of the LED assembly 2 above the heat sink 6, i.e. the distance between the upper side of the heat sink 6 and the underside of the printed-circuit board 4, is exactly defined. For this purpose, in the heat-conducting adhesive 5 (or in the heat-conducting paste) defined distance elements, preferably in the form of glass spherules 7 are incorporated, which, when the LED assembly 1 plus printed-circuit board 4 is pressed onto the heat sink 6, define the spacing between the printed-circuit board 4 and the heat sink 6. Above all, these glass spherules 7 also ensure an electrical insulation as well as a minimum thickness of the adhesive 5.

The heat sink 6 on its upper side has centering pins 8, which in the mounted state of the printed-circuit board 4 project through centering holes 9 provided in the printed-circuit board 4. In this case, as is evident from FIG. 2, there is a clearance between the edge of the centering holes 9 and the outside of the centering pins 8 to allow the printed-circuit board 4 plus the LED assembly 1 preassembled thereon to be additionally adjusted relative to the heat sink 6. In the correctly adjusted position, in which—as is important here—the LED assembly 1 occupies the most exact position possible relative to the heat sink 6, in the embodiment according to FIGS. 1 and 2 the printed-circuit board 4 plus preassembled LED assembly 1 is fixed with the aid of a fast-curing adhesive 10, wherein this adhesive 10 is applied for example in the shape of a ring around the respective centering pin 8 in the region of the centering hole 9.

Figure 3:
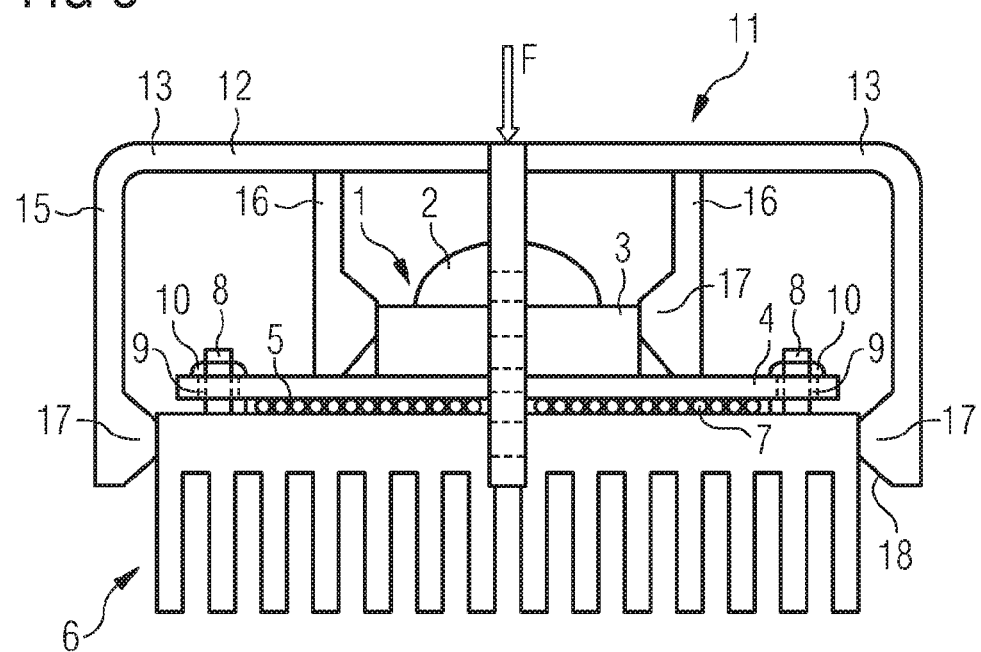
FIG. 3 in a diagrammatic view similar to FIG. 2 the mounting of a modified LED assembly on a heat sink.

In order to carry out this exact positioning or fine adjustment of the LED assembly 1 relative to the heat sink 6, a bow-like positioning body 11 that may be seen in FIG. 2 is used, which in the embodiment according to FIG. 2 (and also according to FIG. 3 and FIG. 4) comprises an, in plan view cross-shaped, upper connecting part 12 (see FIG. 4), which at the ends of the cross arms 13 and/or 14 as well as in a region lying further in, see the representation in FIGS. 2 and 3, has downwardly projecting limbs 15 and/or 16 that in the embodiment, as represented, are integrally provided. In this case, the altogether four outer limbs 15 (see FIG. 4) are seated with the aid of centering elements 17 on four side faces of the heat sink 6, and in a corresponding manner the inner limbs 16 are seated with the aid of corresponding centering elements 17 on four side faces of the substrate or housing 3 of the LED assembly 1. The centering elements 17 in this case are preferably formed by planar (optionally however also rounded, e.g. spherical-cup-shaped) end faces of—at least at the underside—beveled projections as centering faces, as may be seen for example from the representation according to FIG. 2. Theoretically, it would however also be conceivable to provide, instead of the integral construction of the positioning body, a multi-part construction, wherein for example the limbs 15 and/or 16 (or parts thereof) might be manufactured from spring steel so as to enable better compensation of any tolerances of the heat sink 6. To this extent, a multi-part construction of the positioning body 11, optionally also a construction having thinner and hence more easily bendable regions or having regions made of different materials, is perfectly feasible and advantageous.

As regards the centering elements and the seating faces or fit faces on the LED assembly 1, printed-circuit board 4 and/or heat sink 6 that interact with these centering elements 17, it is advantageous if the centering elements 17 act upon appropriate points—in terms of tolerances—of for example the LED assemblies 1, such as for example upon the housing and/or a housing edge, but optionally also upon a lens that may be contained in the LED assembly 1 or upon sprue domes. If the carrier body or heat sink 6 is intended for example for use in headlamps, the seating- or fit faces for the centering elements 17 should advantageously be at locations that are used to align the whole module relative to the headlamp or to the reflector or to an optical system. The fit faces of the carrier body 6 may, with a view to close tolerances, also be post-worked, for example by milling, punching, grinding, slotting, even if the carrier body should be a metal die-cast part. Special materials such as magnesium are possibly directly after die casting already close-tolerance enough to render post-working superfluous in this case. With regard to an alignment relative to the optical system, to the overall headlamp system, the seating- or fit faces for the centering elements 17 may possibly also be recesses, in particular round, optionally conical recesses, cf. moreover the embodiment according to FIGS. 5 and 6 that is to be described in more detail below.

The length of the inner limbs 16, which are seated by their centering elements 17 laterally on the housing or substrate 3 of the LED assembly 1, is preferably so dimensioned that, when the positioning body 11 is pressed onto the arrangement comprising heat sink (lead frame) 6, printed-circuit board 4 and LED assembly 1 preassembled thereon, the bottom ends of these limbs 16 come to rest on the upper side of the printed-circuit board 4, so that via the positioning body 11 a pressure may be exerted on the printed-circuit board 4, see also the arrow representing a force K in FIG. 3, in order to press the printed-circuit board 4 towards the upper side of the heat sink 6, while achieving the predetermined spacing defined by the glass spherules 7, when the LED assembly 1 is brought into position relative to the heat sink 6.

Figure 4:
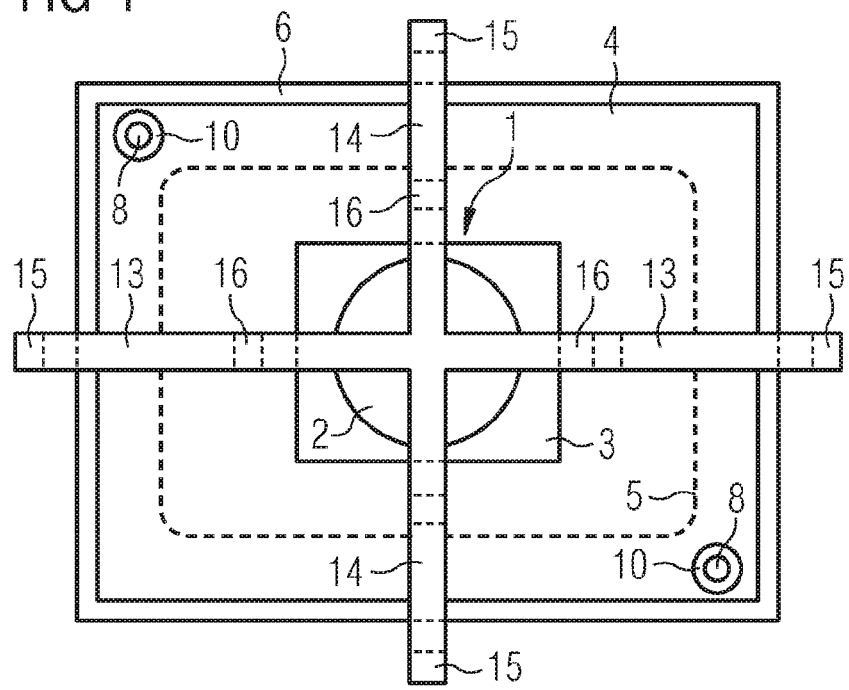
FIG. 4 a diagrammatic plan view of the arrangement according to FIG. 3 to illustrate the cross shape of the positioning body used for the positioning and mounting of the LED assembly.

In a lateral direction (left-right as well as front-back according to the representation for example in FIG. 1 or 4) the centering elements 17 on the limbs 15, 16 centre the LED assembly 1 relative to the heat sink 6, wherein the centering elements 17 on the outer limbs 15 define the position for the positioning body 11, with the result that the centering elements 17 on the inner limbs 16 adjust the LED assembly 1 and, with it, the printed-circuit board 4 relative to the heat sink 6 into the desired, correct position relative to the heat sink 6. To facilitate this adjustment and/or the placing-on of the positioning body 11, the centering elements 17, as mentioned and as is evident from the drawings, for example FIG. 2 and FIG. 3, preferably have bevels 18 at the underside.

FIGS. 2A to 2C show various steps during the positioning and mounting of the LED assembly 1 plus printed-circuit board 4 on the lead frame, namely heat sink 6, wherein these method steps apply analogously also to the embodiment according to FIGS. 3 and 4 as well as to the further embodiments.

According to FIG. 2A an LED assembly 1 preassembled on a printed-circuit board 4 is applied in accordance with the arrow direction onto the upper side of a heat sink 6, wherein centering pins 8 provided on the heat sink 6 finally project through centering holes 9 of the printed-circuit board 4. A heat-conducting adhesive 5 or a heat-conducting paste with admixed glass spherules 7 has previously been applied in a layer (optionally in regions or in the form of dots) either to the underside of the printed-circuit board 4 or, as shown in FIG. 2A, to the upper side of the heat sink 6. In the case of the adhesive 5, this definitively connects the printed-circuit board 4 plus the LED assembly 1 fitted thereon permanently with a defined spacing to the heat sink 6; this connection may however, as mentioned, also be achieved by the fast-curing adhesive 10.

According to FIG. 2B, for fine adjustment of the LED assembly 1 relative to the heat sink 6—while the adhesive 5 is still soft—a positioning- or fixing body 11 having centering elements 17 provided on outer limbs 15 and inner limbs 16 is pressed in accordance with the arrow direction (see FIG. 2B) onto the arrangement, comprising heat sink 6 as well as printed-circuit board 4 with LED assembly 1, wherein the length of the limbs 15 and 16 is so dimensioned that the centering elements 17 of the outer limbs 15 come to rest laterally against the heat sink 6, cf. FIG. 2C, while at the same time the centering elements 17 on the inner limbs 16 are seated laterally on the housing or substrate 3 of the LED assembly 1 as well as, on the other hand, by their bottom end faces on the upper side of the printed-circuit board 4.

In this position according to FIG. 2C a force F is applied to the positioning body 11 from above in order to press the printed-circuit board 4 towards the heat sink 6 and hence achieve the spacing between printed-circuit board 4 and heat sink 6 that is defined by the glass spherules 7 in the heat-conducting adhesive 5.

Before this (see FIG. 2B) or at this point the fast-curing adhesive 10 is applied in order to fix the printed-circuit board 4 in the region of the centering pins 8—provisionally—in the adjusted position. After the positioning body 11 and hence the printed-circuit board 4 have been pressed down towards the heat sink 6, the fast-curing adhesive 10 is cured for example in that, in the case of a UV-curing adhesive 10, by means of a UV radiation source, optionally via a glass fiber-optic conductor 19, UV light is supplied in the region of the adhesive 10, as is shown in FIG. 2C. On the other hand, it is however naturally also possible to use other fast-curing adhesives 10, wherein the adhesive 10 is for example not applied until the phase according to FIG. 2C, in the depressed state of the positioning body 11 on the heat sink 6, and wherein the fast-curing adhesive 10 then cures rapidly for example as a result of (atmospheric) humidity and/or air and/or oxygen.

Immediately after curing of the fast-curing adhesive 10, in the illustrated embodiment according to FIGS. 1 and 2 and/or FIGS. 2A to 2C—as well as in the exemplary embodiment according to FIGS. 3 and 4—the positioning body 11 may be removed, even though the heat-conducting adhesive 5 that definitively connects the printed-circuit board 4 to the heat sink 6 has still not completely cured—the provisional fixing of the printed-circuit board 4 in the region of the centering pins 8 with the aid of the adhesive 10, which has meanwhile cured, is sufficient for this purpose.

A possible alternative, moreover, is previously to insert the printed-circuit board 4 with the LED assembly 1 into the positioning body 11 and then clip the positioning body 11 onto the heat sink (carrier body) 6, wherein the printed-circuit board 4 is finally pressed towards the upper side of the heat sink 6 (with the adhesive 5 or a heat-conducting paste situated therebetween).

Reference has already been made several times above to the embodiment according to FIGS. 3 and 4. This embodiment differs from that according to FIGS. 1 and 2 only in that a slightly modified LED assembly 1, comprising a single, comparatively large LED 2, is provided. As this embodiment in terms of construction and in terms of positioning and mounting of the printed-circuit board 4 with the LED assembly 1 on the lead frame, namely heat sink 6, otherwise corresponds to the embodiment according to FIGS. 1 and 2, for the sake of simplicity and to avoid repetition reference may be made to the previous description.

In the exemplary embodiments according to FIGS. 1 to 4 the only provisionally attached positioning body 11 is preferably made of hardened steel in order to ensure the high positioning accuracy as well as a long service life.

Figure 5:
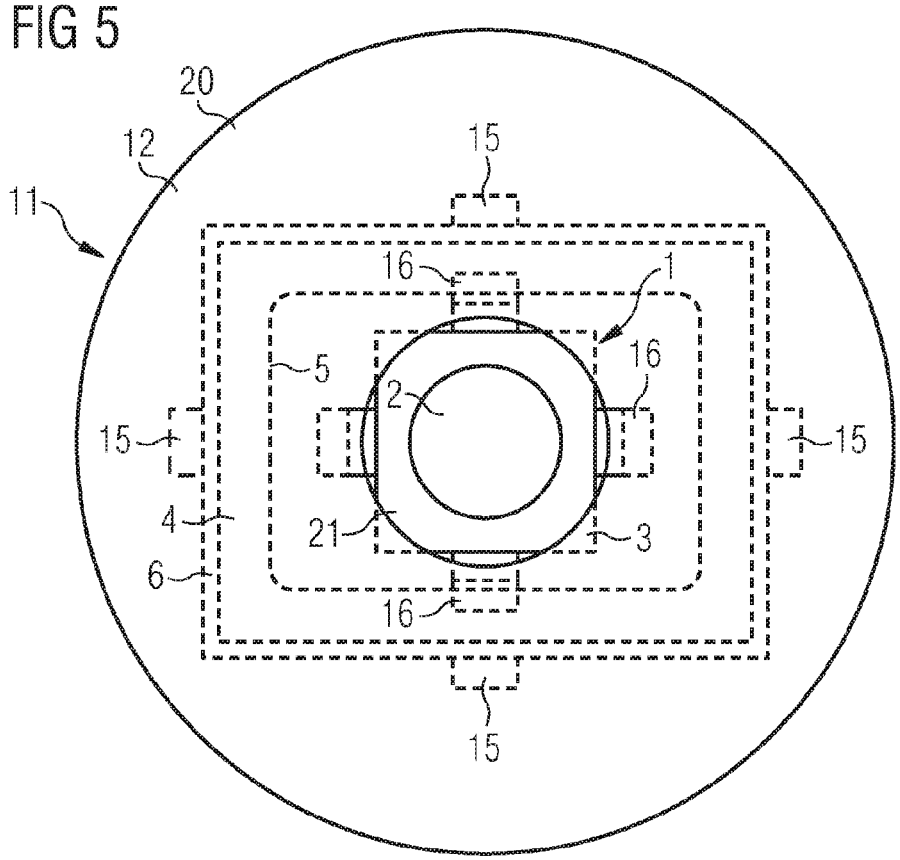
FIGS. 5 and 6 a plan view and an elevation similar to FIGS. 1 and 2 of an arrangement comprising LED assembly and heat sink, wherein for the positioning and mounting a different positioning body to the positioning body according to FIG. 1 or 3 is shown, with a reflector function for permanent installation.
Figure 6:
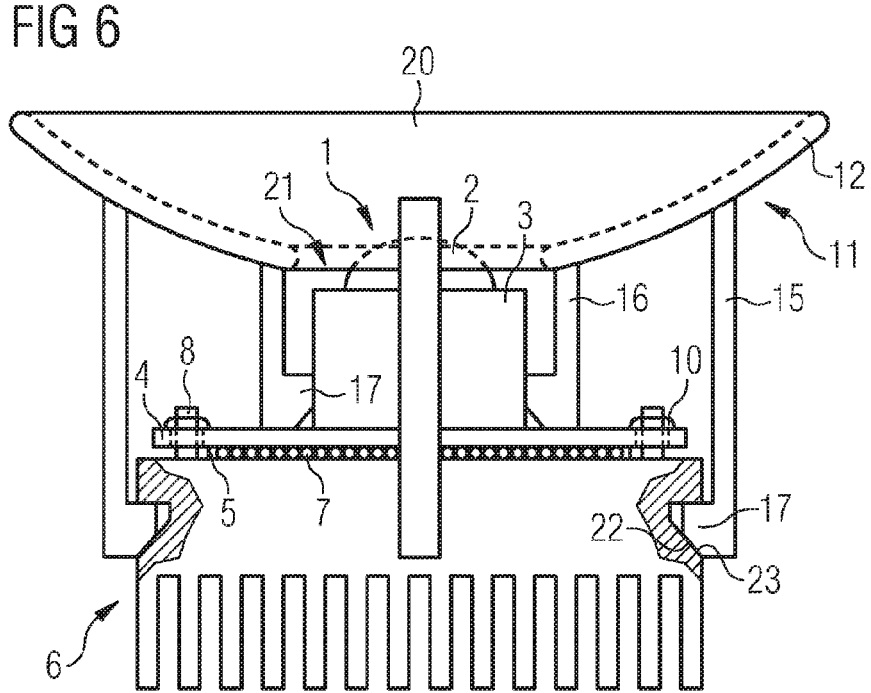

An embodiment that is modified compared to the previous embodiments is represented in FIGS. 5 and 6, wherein here the positioning- or fixing body 11 is left on the heat sink 6 because it still performs a further function. In particular, in the illustrated exemplary embodiment the connecting part 12 of the positioning body 11 forms a parabolic reflector 20 having a for example central opening 21, through which in the mounted state the LED 2 (in a corresponding manner to the embodiment according to FIGS. 3 and 4), optionally also the group of LEDs 2 (see FIGS. 1 and 2), projects. In order to enable this permanent arrangement of the positioning body 11, the heat sink 6 at its lateral surfaces further comprises detent recesses 22, into which in the mounted position the outer limbs 15 engage with centering elements 17 provided as detent projections 23. In this position of the positioning body 11 the bottom end faces of the inner limbs 16 abut the printed-circuit board 4, thereby likewise ensuring the spacing between the underside of the printed-circuit board 4 and the upper side of the heat sink 6 that is predefined by the glass spherules 7.

As the embodiment according to FIGS. 5 and 6 otherwise, and also as far as the prefixing with the aid of the fast-curing adhesive 10 is concerned, corresponds to the previous embodiments, there is no need for further explanation.

Other constructional variants with a permanent positioning body 11 exist for example if the positioning body 11 takes the form of a design element, for example in the case of (for example colored or black) rings, or if a cover is to be provided for the electronic equipment.

Figure 7:
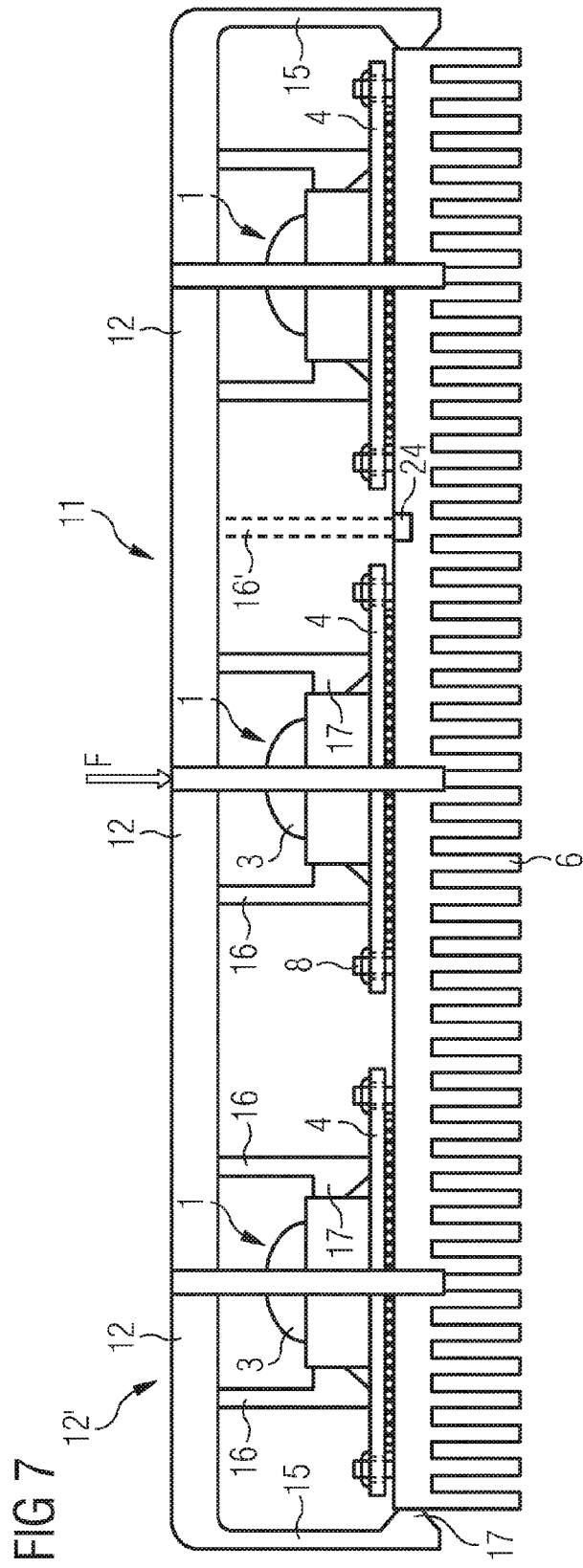
FIGS. 7, 8 and 9 various forms of implementation of the mounting of a plurality of LED assemblies simultaneously on a common heat sink using a common positioning body.

FIG. 7 shows a multiple arrangement of LED assemblies 1 on a common, correspondingly large, flat-topped heat sink 6, wherein each LED assembly 1 is equipped with, and preassembled on, its own printed-circuit board 4. The printed-circuit boards 4 in this case are pre-adjusted in each case in the previously described manner by means of centering pins 8 that project through corresponding centering holes (not specifically denoted in FIG. 7) in the printed-circuit boards 4, and the definitive positioning is effected likewise with the aid of a positioning body 11.

This positioning body 11 in the embodiment according to FIG. 7 takes the form of a multiple positioning body, wherein in comparison to FIGS. 3 and 4 or to FIGS. 1 and 2 a plurality of connecting parts 12 are connected into an integrated unit 12'. This integrated unit 12' of connecting parts 12 likewise has inner limbs 16 in order by means of their centering elements 17 to position the LED assemblies 1 in the previously described manner relative to the heat sink 6. On the other hand, because an integral, flat-topped heat sink 6 is provided for all of the LED assemblies 1, here it is only in the outer region that outer limbs 15 are required and provided for seating (likewise via the centering elements 17) on the side surfaces of the heat sink 6. If required, stop faces 24 may however be provided also in the inner surface region of the heat sink 6 and be formed for example by recesses (optionally by projections), which interact with limbs 16', indicated merely by dashes, and/or with centering elements provided on the ends thereof (not represented in detail in FIG. 7, cf. however the centering elements 17) in order to promote the exact positioning of the LED assemblies 1 relative to the heat sink 6 also in the inner region by means of these centering- or stop faces.

Figure 8:
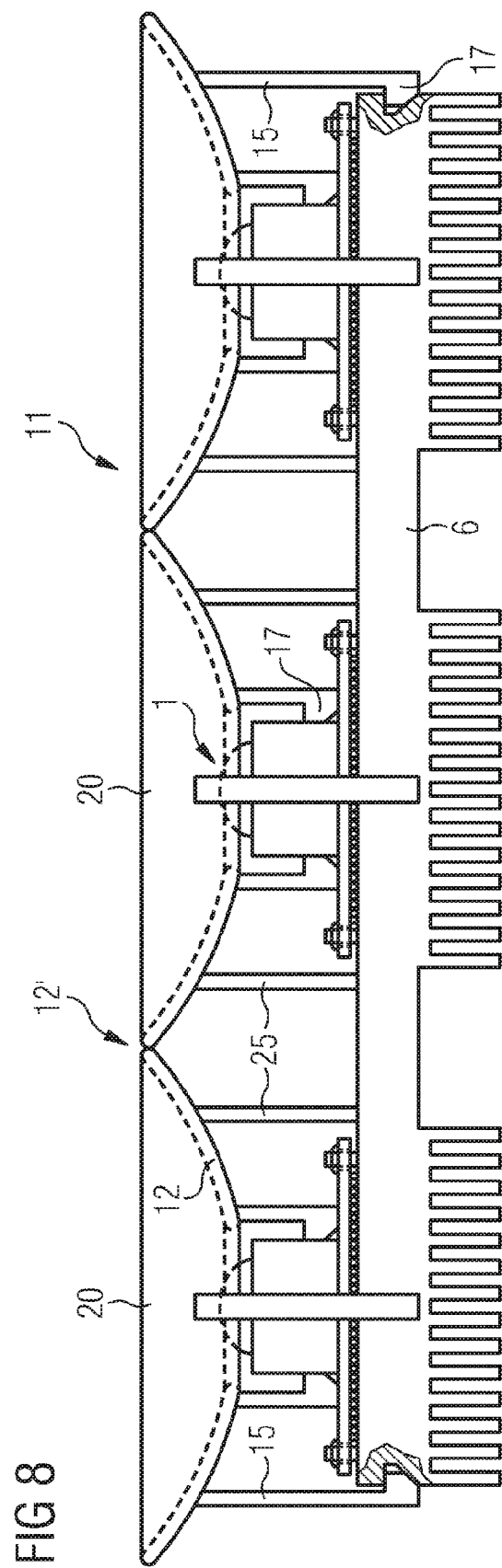

A similar embodiment to that in FIG. 7 is shown in FIG. 8, here however taking as a basis the dual-function positioning body, namely having the reflector faces 20 on the individual connecting parts 12. Here too, an integrated unit 12' of connecting parts 12 having limbs 15, 16 plus centering elements 17 is provided, in a similar manner to FIG. 7, but now taking as a basis the embodiment according to FIGS. 5 and 6.

It is additionally represented in FIG. 8 that support elements 25 may also project down from the individual connecting parts 12 and/or reflectors 20 in order to support the reflectors 20 via these support elements 25 on the heat sink 6 and hence prevent the position of the reflectors 20 from being pressed inwards during operation. It should be added here that such permanent positioning bodies 11, for example with reflectors 20, are preferably made of a plastics material, such as for example a glass-fiber-reinforced plastics material; it is optionally possible also to use glass and/or metal for specific applications.

It is of course conceivable to provide support elements 25 of the type described above with reference to FIG. 8 also on the unit 12' according to FIG. 7, even though an adequate level of support should be provided there by the seating of the bottom ends of the inner limbs 16 on the upper side of the printed-circuit boards 4.

Figure 9:
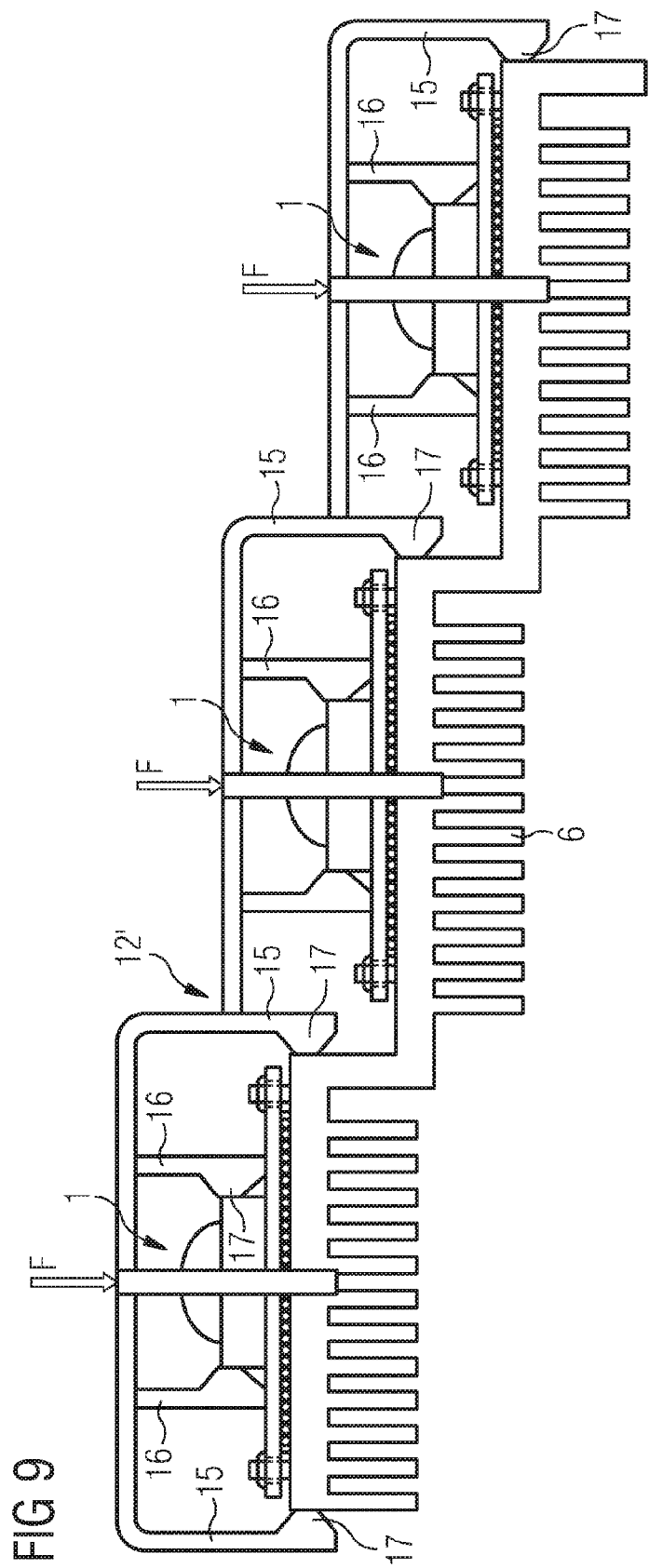

FIG. 9 finally shows a multiple arrangement that is slightly modified compared to FIG. 7, wherein here the heat sink 6 as well as the positioning body 11 are of a stepped construction, and wherein in each case at one side of the steps, as is evident from the drawing, "outer" limbs 16 are provided for seating purposes in the free step sides of the individual heat sink parts. The connecting parts unit 12' in this case is stepped in accordance with the steps of the carrier body 6, thereby producing in each case limbs 15, 16 of an adequate length that ensure the exact positioning of the LED assemblies 1 with simultaneous compensation of manufacturing tolerances.

What is claimed is:

1. A method of positioning and mounting at least one LED assembly, which is preassembled on a printed-circuit board, on a carrier body, the method comprising the steps of:
   placing the printed-circuit board with the LED assembly onto the carrier body,
   then adjusting a relative alignment between the LED assembly and the carrier body using a removable positioning body comprising centering elements that come to rest on the one hand on the LED assembly or the printed-circuit board thereof and on the other hand on the carrier body, and
   then fixing the printed-circuit board to the carrier body with an adhesive.

2. The method according to claim 1, wherein before the positioning body is attached, the printed-circuit board is placed by means of centering holes onto centering pins provided on the carrier body.

3. The method according to claim 1, wherein the printed-circuit board after attachment of the positioning body is fixed on the carrier body with the aid of a fast-curing adhesive or a UV-curing adhesive.

4. The method according to claim 1, wherein after the positioning of the LED assembly relative to the carrier body the printed-circuit board is glued on the carrier body by means of a heat-conducting adhesive with the simultaneous incorporation of distance elements, wherein the distance elements can be glass spherules.

5. The method according to claim 1, wherein after the fixing of the printed-circuit board on the carrier body with the aid of the fast-curing adhesive the positioning body is removed.

6. The method according to claim 5, wherein after removal of the positioning body the heat-conducting adhesive between the printed-circuit board and the carrier body is still being completely cured.

7. The method according to claim 1, wherein the positioning body is left in its position as a functional body.

8. The method according to claim 1, wherein a plurality of LED assemblies, each preassembled on a printed-circuit board, are simultaneously positioned by means of a common positioning body on a carrier body having a plurality of mounting locations for the LED assemblies.

9. A positioning body for implementing the method of positioning and mounting at least one LED assembly, which is preassembled on a printed-circuit board, on a carrier body, the positioning body comprising:
   a connecting part;
   a plurality of limbs projecting from the connecting part; and
   respective centering elements disposed on corresponding limbs, the respective centering elements configured to seat either on the LED assembly or on the carrier body.

10. The positioning body according to claim 9, wherein at least one of the centering elements is formed by a centering face.

11. The positioning body according to claim 9, wherein at least one of the centering elements is formed by a detent projection that snaps into a recess on the carrier body.

12. The positioning body according to claim 9, wherein the connecting part is of a cross-shaped construction, wherein the limbs project down from the cross arms.

13. The positioning body according to claim 9, wherein the connecting part takes the form of a concave reflector having an opening for passage of the LED, wherein the limbs project down from the rear of the reflector.

14. The positioning body according to claim 9, wherein a plurality of connecting parts, each with downwardly projecting limbs, are connected into an integrated unit.

15. The positioning body according to claim 14, wherein the connecting parts are connected into the integrated unit with the simultaneous formation of steps.

16. The positioning body according to claim 14, wherein, in the case of association with a common carrier body for mounting a plurality of LED assemblies in one plane, only the outer regions of the connecting parts unit are provided with limbs provided for seating on the sides of the common carrier body.

17. The positioning body according to claim 9, wherein the positioning body is made of a material that is harder than the carrier body and the LED assembly or assemblies.

18. The positioning body according to claim 9, wherein the positioning body is made of hardened steel.

19. The positioning body according to claim 9, wherein the positioning body is made of glass-fiber-reinforced plastics material.

20. The method according to claim 1, wherein the positioning body is left in its position as a reflector, design element or cover.

* * * * *